(12) United States Patent
Bhattad et al.

(10) Patent No.: US 9,369,885 B2
(45) Date of Patent: Jun. 14, 2016

(54) METHOD AND APPARATUS FOR SELECTING REFERENCE SIGNAL TONES FOR DECODING A CHANNEL

(75) Inventors: Kapil Bhattad, San Diego, CA (US); Ke Liu, San Diego, CA (US); Tao Luo, San Diego, CA (US); Yongbin Wei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 104 days.

(21) Appl. No.: 13/269,408

(22) Filed: Oct. 7, 2011

(65) Prior Publication Data

US 2012/0263247 A1 Oct. 18, 2012

Related U.S. Application Data

(60) Provisional application No. 61/474,699, filed on Apr. 12, 2011.

(51) Int. Cl.
| | |
|---|---|
| *H04B 1/00* | (2006.01) |
| *H04J 11/00* | (2006.01) |
| *H04B 7/00* | (2006.01) |
| *H04W 24/02* | (2009.01) |

(Continued)

(52) U.S. Cl.
CPC ............ *H04W 24/02* (2013.01); *H04L 5/0053* (2013.01); *H04L 25/0202* (2013.01); *H04L 27/2601* (2013.01); *H04W 84/045* (2013.01)

(58) Field of Classification Search
CPC ...... H04L 5/0007; H04L 5/0053; H04L 5/006; H04L 27/2601; H04L 27/2626; H04L 5/0058; H04L 1/1854
USPC ............................................ 375/147; 370/203
See application file for complete search history.

(56) References Cited

U.S. PATENT DOCUMENTS

| 6,359,923 B1 * | 3/2002 | Agee ................. H04B 1/69 370/342 |
|---|---|---|
| 7,684,523 B2 | 3/2010 | Wang et al. |

(Continued)

FOREIGN PATENT DOCUMENTS

| CN | 101977066 A | 2/2011 |
|---|---|---|
| WO | 2007075736 A2 | 7/2007 |

(Continued)

OTHER PUBLICATIONS

Partial International Search Report—PCT/US2012/031904—ISA/EPO—May 23, 2012.

(Continued)

*Primary Examiner* — Chieh M Fan
*Assistant Examiner* — Sarah Hassan
(74) *Attorney, Agent, or Firm* — Arent Fox LLP

(57) ABSTRACT

Methods and apparatuses are provided that include selecting reference signal (RS) or other tones to utilize in estimating a channel for decoding one or more channels. Where the RS tones are interfered by other base stations, interference cancelation can be performed over the RS tones. Since interference can vary over the tones, interference cancelation can yield RS tones of varying quality. Thus, a quality of each of the RS tones can be determined, and at least a subset of the RS tones can be selected for estimating a channel. Additionally or alternatively, the RS tones can be weighted or otherwise classified for performing channel estimation using the RS tones.

22 Claims, 12 Drawing Sheets

(51) Int. Cl.
  *H04L 27/26* (2006.01)
  *H04L 5/00* (2006.01)
  *H04L 25/02* (2006.01)
  *H04W 84/04* (2009.01)

(56) References Cited

U.S. PATENT DOCUMENTS

| | | | |
|---|---|---|---|
| 8,811,348 B2 | 8/2014 | Rangan et al. | |
| 2002/0159506 A1* | 10/2002 | Alamouti | H04B 7/0617 375/147 |
| 2004/0086027 A1* | 5/2004 | Shattil | H04L 25/03834 375/146 |
| 2005/0085197 A1* | 4/2005 | Laroia et al. | 455/101 |
| 2005/0094550 A1* | 5/2005 | Huh | H04L 5/0007 370/203 |
| 2006/0115010 A1* | 6/2006 | Rog | H04L 27/2618 375/260 |
| 2007/0105575 A1* | 5/2007 | Sampath | H04W 52/243 455/509 |
| 2008/0089312 A1 | 4/2008 | Malladi et al. | |
| 2008/0267122 A1* | 10/2008 | Han et al. | 370/329 |
| 2009/0238289 A1 | 9/2009 | Sampath et al. | |
| 2009/0247084 A1* | 10/2009 | Palanki | 455/63.1 |
| 2010/0008282 A1 | 1/2010 | Bhattad et al. | |
| 2010/0317343 A1 | 12/2010 | Krishnamurthy et al. | |
| 2010/0322227 A1 | 12/2010 | Luo | |
| 2011/0026652 A1 | 2/2011 | Kent et al. | |
| 2011/0080896 A1 | 4/2011 | Krishnamurthy et al. | |
| 2011/0143672 A1 | 6/2011 | Yoo et al. | |
| 2012/0113917 A1 | 5/2012 | Gaal et al. | |
| 2013/0250793 A1 | 9/2013 | Bhattad et al. | |

FOREIGN PATENT DOCUMENTS

| | | |
|---|---|---|
| WO | 2010006285 A2 | 1/2010 |
| WO | 2010054474 A1 | 5/2010 |
| WO | 2010099736 A1 | 9/2010 |
| WO | 2011005537 A2 | 1/2011 |

OTHER PUBLICATIONS

Samsung: "CSI measurement issue for macro-femto scenarios", 3GPP Draft; R2-110433, 3rd Generation Partnership Project (3GPP), Mobile Competence Centre; 650, Route des Lucioles; F-06921 Sophia-Antipolis Cedex; France, vol. RAN WG2, No. Dublin, Ireland; 20110117, Jan. 11, 2011, XP050493043, [retrieved on Jan. 11, 2011].

Fahimeh Rezaei : "A Comprehensive Analysis of LTE Physical Layer", University of Nebraska—Lincoln, Dec. 2, 2010, XP002681168, Retrieved from the Internet : URL: http : //digital commons.unl.edu/ceendiss/8/ [retrieved on Aug. 1, 2012] p. 59, paragraph 5.3.1.5—p. 61, paragraph 5.3.1.6.

International Search Report and Written Opinion—PCT/US2012/031904—ISA/EPO—Aug. 13, 2012.

New Postcom: "Design of PDSCH Muting for CSI-RS in LTE-Advanced", 3GPP Draft; R1-105223 Design of PDSCH Muting for CSI-RS in ETE-Advanced Final, 3rd Generation Partnership Project (3GPP) , Mobile Competence Centre; 650, Route des Lucioles; F-06921 Sophia-Antipolis Cedex, France; vol.; RAN WG1, No. 62bis; Xi 'an, China; 20101011, Oct. 4, 2010, XP050450328.

European Search Report—EP14167435—Search Authority—Munich—Aug. 11, 2014.

Translation of Office Action for Japanese Patent Application No. 2014-505178 dated Oct. 28, 2014.

European Search Report—EP15157409—Search Authority—Munich—Jul. 3, 2015.

* cited by examiner

METHOD AND APPARATUS FOR SELECTING REFERENCE SIGNAL TONES FOR DECODING A CHANNEL

CLAIM OF PRIORITY UNDER 35 U.S.C. §119

The present application for patent claims priority to Provisional Application No. 61/474,699, entitled "METHOD AND APPARATUS FOR SELECTIVE REFERENCE SIGNAL USE IN PHYSICAL BROADCAST CHANNEL INTERFERENCE CANCELATION," filed Apr. 12, 2011, assigned to the assignee hereof and hereby expressly incorporated by reference herein.

BACKGROUND

1. Field

The following description relates generally to wireless network communications, and more particularly to using reference signals for decoding communications.

2. Background

Wireless communication systems are widely deployed to provide various types of communication content such as, for example, voice, data, and so on. Typical wireless communication systems may be multiple-access systems capable of supporting communication with multiple users by sharing available system resources (e.g., bandwidth, transmit power, . . . ). Examples of such multiple-access systems may include code division multiple access (CDMA) systems, time division multiple access (TDMA) systems, frequency division multiple access (FDMA) systems, orthogonal frequency division multiple access (OFDMA) systems, and the like. Additionally, the systems can conform to specifications such as third generation partnership project (3GPP) (e.g., 3GPP LTE (Long Term Evolution)/LTE-Advanced), ultra mobile broadband (UMB), evolution data optimized (EV-DO), etc.

Generally, wireless multiple-access communication systems may simultaneously support communication for multiple mobile devices. Each mobile device may communicate with one or more base stations via transmissions on forward and reverse links. The forward link (or downlink) refers to the communication link from base stations to mobile devices, and the reverse link (or uplink) refers to the communication link from mobile devices to base stations. Further, communications between mobile devices and base stations may be established via single-input single-output (SISO) systems, multiple-input single-output (MISO) systems, multiple-input multiple-output (MIMO) systems, and so forth.

In addition, some wireless networks allow deployment of lower power base stations (e.g., femto nodes, pico nodes, micro nodes, etc.), to which a device can connect to receive alternative wireless network access. For example, the lower power base station can communicate with the wireless network over a broadband or other backhaul connection (e.g., a digital subscriber line (DSL) connection, T1 connection, cable connection, etc.), while also providing an access link over which devices can communicate therewith to receive access to the wireless network. Lower power base stations can be deployed within macrocell base station coverage areas, and as such, in some examples, devices communicating with the lower power base station may have lower path loss than from a macrocell base station but may have lower received power than the macrocell base station due to stronger transmit downlink power from the macrocell base station. The device, however, may desire to communicate and/or establish connection with the lower power base station (e.g., to receive additional services, increased data rate, or other factors that can improve overall system performance), in which case the macrocell base station can cause interference to communications from the femto node at the device.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, the present disclosure describes various aspects in connection with canceling interference caused over a broadcast channel of a femto node or similar lower power base station by another base station. For example, a device can obtain a plurality of reference signal (RS) tones from a plurality of RSs of the femto node, and can modify the RS tones to remove interference from one or more other base stations. The device can determine a quality associated with each of the RS tones, and can determine at least a subset of the RS tones to utilize for estimating a channel based on the quality, from which a data channel can be decoded. For example, the device can experience different levels of interference over each of the plurality of RS tones, and thus determining the quality of the RS tones after interference cancelation allows the device to utilize more favorable tones to estimate a channel for decoding the data channel.

According to an example, a method of wireless communication is provided that includes receiving a plurality of RS tones from a plurality reference signals from a first base station, modifying the plurality of RS tones to remove interference from at least another base station, and determining a quality of the plurality of RS tones as modified. The method further includes obtaining at least one channel estimate based on the quality of the plurality of RS tones and decoding a data channel of the first base station based on the at least one channel estimate.

In another aspect, an apparatus for wireless communication is provided. The apparatus includes means for receiving a plurality of RS tones in a plurality reference signals from a first base station, means for modifying the plurality of RS tones to remove interference from at least one other base station, and means for determining a quality of the plurality of RS tones as modified. The apparatus also includes means for obtaining at least one channel estimate of at least one data tone based on the quality of the plurality of RS tones and means for decoding a data channel of the first base station based on the at least one channel estimate.

In yet another aspect, an apparatus for wireless communication is provided including at least one processor configured to receive a plurality of RS tones in a plurality reference signals from a first base station, modify the plurality of RS tones to remove interference from at least one other base station, and determine a quality of the plurality of RS tones as modified. The at least one processor is further configured to obtain at least one channel estimate of at least one data tone based on the quality of the plurality of RS tones and decode a data channel of the first base station based on the at least one channel estimate. The apparatus further includes a memory coupled to the at least one processor.

Still, in another aspect, a computer-program product for wireless communication is provided including a computer-readable medium having code for causing at least one computer to receive a plurality of RS tones in a plurality reference signals from a first base station, code for causing the at least one computer to modify the plurality of RS tones to remove interference from at least one other base station, and code for causing the at least one computer to determine a quality of the plurality of RS tones as modified. The computer-readable medium further includes code for causing the at least one computer to obtain at least one channel estimate of at least one data tone based on the quality of the plurality of RS tones and code for causing the at least one computer to decode a data channel of the first base station based on the at least one channel estimate.

According to an example, a method for muting tones at a first base station to aid in decoding channels of a second base station in a subframe is provided that includes determining a location of one or more tones over which a base station transmits a reference signal and muting a subset of tones corresponding to the location of the one or more tones.

In another aspect, an apparatus for muting tones at a first base station to aid in decoding channels of a second base station in a subframe is provided. The apparatus includes means for determining a location of one or more tones over which a base station transmits a reference signal and means for muting a subset of tones corresponding to the location of the one or more tones.

In yet another aspect, an apparatus for muting tones at a first base station to aid in decoding channels of a second base station in a subframe is provided including at least one processor configured to determine a location of one or more tones over which a base station transmits a reference signal. The at least one processor is further configured to mute a subset of tones corresponding to the location of the one or more tones. The apparatus further includes a memory coupled to the at least one processor.

Still, in another aspect, a computer-program product for muting tones at a first base station to aid in decoding channels of a second base station in a subframe is provided including a computer-readable medium having code for causing at least one computer to determine a location of one or more tones over which a base station transmits a reference signal. The computer-readable medium further includes code for causing the at least one computer to mute a subset of tones corresponding to the location of the one or more tones.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
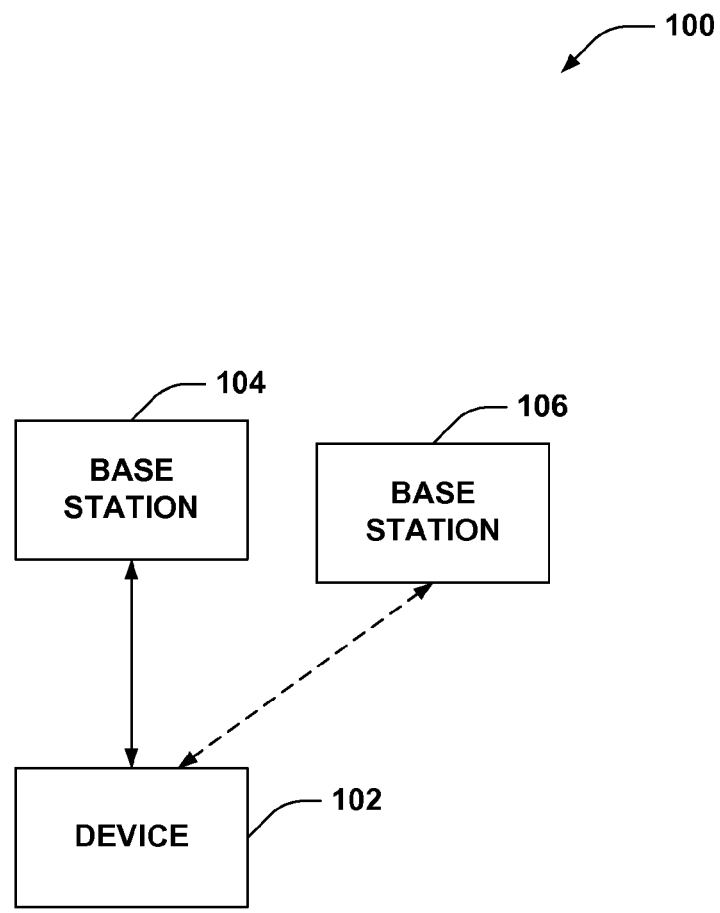
FIG. 1 is a block diagram of an aspect of a system for decoding base station communications.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

Described further herein are various considerations related to estimating a channel of a femto node or other lower power base station based in part on a quality of interference-canceled reference signal (RS) tones. Though the aspects described herein often refer to a femto node, it is to be appreciated that substantially any low power base station can be used to perform functionality and achieve results described herein, such as a home Node B or home eNode B (H(e)NB), a pico node, micro node, etc. For example, a device can decode a broadcast channel of the macrocell base station using channel estimates from RSs received therefrom, and can cancel the broadcast channel of the macrocell base station by using channel estimates either from RSs, from a corresponding data region, or from both RSs and the data region. The device can use the received signal after cancelation to obtain channel estimates for the weaker femto node from one or more RSs thereof, and can perform decoding of a broadcast channel for the femto node using the interference-canceled samples. The device, however, can experience different levels of interference from the macro node over the broadcast channel and/or one or more RSs of the femto node.

In this regard, the device can determine a quality of the interference-canceled samples, and can select samples (e.g., tones) to utilize in performing a channel estimate of the broadcast channel of the femto node. For example, the device can select samples having a highest measured quality metric (e.g., SNR) before or after canceling the interference. In another example, the device can determine quality of the samples based in part on a channel partitioning between the femto node and the macrocell base station (e.g., select RS samples based on whether they are in a PBCH region, a control region, a data region, etc.). In yet another example, the device can determine a quality of the samples based in part on a measured power of the samples, frequency offset, rate of change or channel variation, and/or other considerations described further herein. Moreover, the device can alternatively weight and/or classify samples to use in performing the channel estimation according to the foregoing considerations. In this regard, reliability of decoding of the broadcast channel of a femto node can be improved based on using desirable RS samples in performing channel estimation for decoding the channel.

As used in this application, the terms "component," "module," "system" and the like are intended to include a computer-related entity, such as but not limited to hardware, firmware, a combination of hardware and software, software, or software in execution, etc. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, terminal, communication device, user agent, user device, or user equipment (UE), etc. A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, a tablet, a smart book, a netbook, or other processing devices connected to a wireless modem, etc. Moreover, various aspects are described herein in connection with a base station. A base station may be utilized for communicating with wireless terminal(s) and may also be referred to as an access point, a Node B, evolved Node B (eNB), or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE/LTE-Advanced and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

FIG. 1 illustrates an example system 100 for communicating with a base station when interfered by at least another base station. System 100 includes a device 102 that communicates with base station 104. Signals received from base station 104, for example, can be interfered by signals transmitted by base station 106 over a similar frequency spectrum in similar time periods. Device 102 can be a UE, a modem (or other tethered device), a portion thereof, and/or the like. Base stations 104 and 106 can each be a macrocell base station, a femto node, pico node, micro node, or other low power base station, a relay, a mobile base station, a device (e.g., communicating in peer-to-peer or ad-hoc mode), a portion thereof, and/or the like.

In some network deployments, for example, device 102 can communicate with base station 104 though base station 104 exhibits a lower received signal power at device 102 than base station 106. For example, in a heterogeneously deployed network comprising femto nodes, where base station 104 is a femto node, device 102 can communicate with base station 104 while base station 106 can be a macrocell base station offering an improved signal quality over base station 104. Base station 104, however, can provide additional services, improved bandwidth capabilities, improved network performance due to cell splitting gains with range expansion and resource partitioning, and/or other considerations, such that device 102 can prefer to communicate with base station 104 over base station 106 where possible. Thus, where channels transmitted by base station 104 are interfered by base station 106, device 102 can remove the interference from base station 106 to process channels from base station 104.

For example, where base stations 104 and 106 operate using a similar network technology, the base stations 104 and 106 can overlap channel transmissions. Thus, device 102 can estimate a channel of base station 106 in a received signal that interferes with a similar desired channel of base station 104. The device 102 can then decode the channel from base station 106 based on the channel estimate and cancel the channel from the signal. The device 102 can use the resulting signal to obtain channel estimates for decoding a similar channel communicated by base station 104. The device 102 can utilize RS tones in the signal to perform the channel estimations.

For example, a tone can refer to a portion of frequency over the symbol in a portion of time. In one example, device 102 and base stations 104 and 106 can communicate using orthogonal frequency division multiplexing (OFDM) having a frame including one or more subframes where each subframe can include a number of OFDM symbols. The OFDM symbols can correspond to time periods within the subframe. In addition, each OFDM symbol can be divided into a number of tones (or subcarriers) of an operating frequency such that each tone can be utilized to transmit at least a portion of a signal. In addition, certain symbols and/or tones can be reserved for specific purposes. In one example, a broadcast channel region is defined as one or more symbols, and each of base station 104 and 106 can use the tones within the region for transmitting signals corresponding to the broadcast channel.

Base station 104 can transmit various RS tones that can be utilized for performing channel estimation of other channels transmitted by base station 104. Depending on where the RS tones are transmitted, the device 102 can experience varying levels of interference from base station 106. For example, where RS tones from base station 104 are transmitted in the broadcast channel region, the RS tones can be interfered by broadcast channel transmissions from base station 106. The device 102 can decode the broadcast channel of the base station 106 based on RS tones of the base station 104, and can cancel the broadcast channel from the RS tones in the broadcast channel region. Where the base station 104 transmits RS tones in other regions, however, the RS tones may be interfered by RSs from base station 106, data from base station 106, and/or the like. In these cases, the level of interference over given RS tones may not be consistent, and thus, interference cancelation may not be as accurate upon canceling the broadcast channel of base station 106.

Thus, device 102 can determine a quality of one or more RS tones received from base station 104 after canceling interference from base station 106. Device 102 can select a portion of the one or more RS tones having at least a threshold quality to perform channel estimations for decoding a broadcast channel or other channels of base station 104. In another example, device 102 can assign weights to the RS tones corresponding to the quality, and can thus utilize higher quality RS tones with a higher weight to decode the broadcast channel, while placing less consideration on RS tones with a lower weight. Device 102 can determine the quality of the RS tones based on at least one of signal measurements of the RS tones (e.g., signal-to-interference-and-noise ratio (SINR)), determining a channel partitioning between base stations 104 and 106, determining whether RS transmissions of base station 104 and 106 are colliding or non-colliding over the RS tones, determining a power utilized to transmit the RS tones, power levels received on the RS tones, and/or the like. Moreover, in one example, device 102 can determine an interference estimate over data tones, or at least a subset of the RS tones, or both and can decode the broadcast channel of base station 104 based also in part on the interference estimate.

Figure 2:
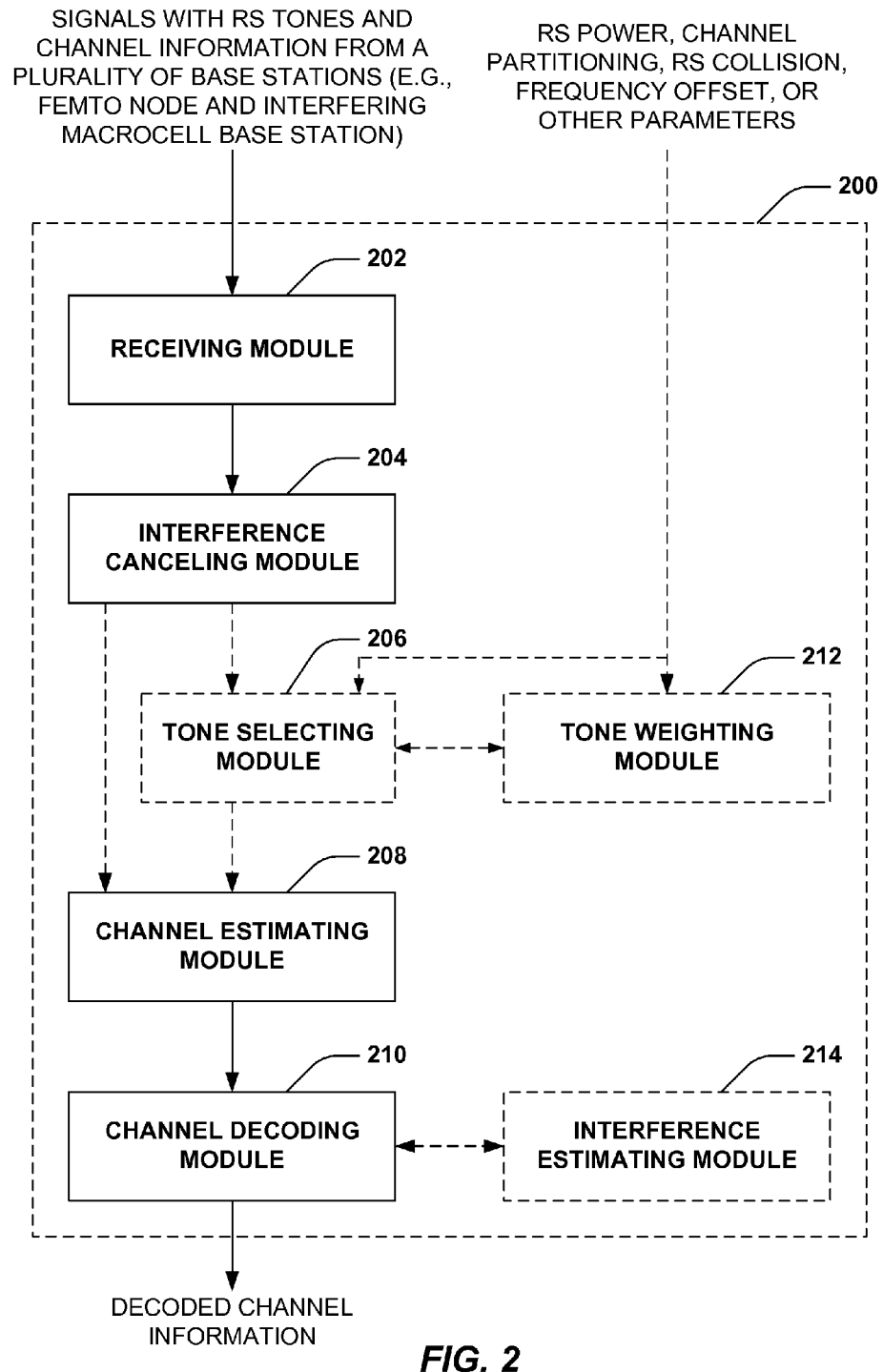
FIG. 2 is a block diagram of an aspect of a system for decoding interference-canceled communications from a base station.

FIG. 2 illustrates an example apparatus 200 for decoding channels from one or more base stations. Apparatus 200 can be a device, such as device 102, that communicates with one or more base stations in a wireless network to receive access thereto, and can include additional modules than those depicted. Apparatus 200 can include a receiving module 202 for receiving signals transmitted by one or more base stations, an interference canceling module 204 for removing interference from the signals caused by one or more base stations, and an optional tone selecting module 206 for selecting one or more tones of the signals from which to perform channel estimation. Apparatus 200 also includes a channel estimating module 208 for performing channel estimation over portions of the signals with interference removed, and a channel decoding module 210 for obtaining channel information based on the channel estimates. Apparatus 200 can optionally include a tone weighting module 212 for assigning weights to one or more tones for performing channel estimates, and/or an interference estimating module 214 for performing interference estimation of at least a subset of the tones to use in decoding the channel information.

According to an example, receiving module 202 can obtain signals with RS tones and channel information from a plurality of base stations (e.g., a femto node and an interfering macrocell base station). Interference canceling module 204 can determine interference from the signals and cancel the interference. In one example, interference canceling module 204 can determine one or more RS tones received from the macrocell base station, and can utilize the tones to perform a channel estimation on a broadcast channel (e.g., primary broadcast channel (PBCH) in LTE) of the macrocell base station. Interference canceling module 204 can decode the broadcast channel based on the channel estimates, and can cancel the broadcast channel and RS tones from the signals to yield a signal from the femto node.

Tone selecting module 206 can determine a plurality of RS tones in the resulting signals. As described, since the RS tones can have been interfered by macrocell base station communications at different levels, depending on the location of the RS tones within a frame and communication properties of the macrocell base station within the frame, some of the interference-canceled RS tones can exhibit a higher quality (e.g., SINR) than others (e.g., tones from which interference could not be canceled). Thus, tone selecting module 206 can determine a quality of the RS tones and can select a portion of the RS tones for performing channel estimation over one or more signals received from the femto node. Channel estimating module 208 can utilize the selected portion of the RS tones in channel estimation to produce one or more data tones, and channel decoding module 210 can decode one or more channels, such as a broadcast channel (e.g., PBCH), data channel (e.g., PDSCH), or other channel of interest of the femto node to produce the decoded channel information. Channel decoding module 210 can utilize the channel information to process other channels received from the femto node, in one example.

In an example, tone selecting module 206 can obtain one or more parameters for determining which tones to select. For instance, tone selecting module 206 can obtain information regarding channel partitioning to determine whether certain RS tones are in certain channel regions (e.g., a control channel region, a data channel region, a broadcast channel region, etc.). As described, the macrocell base station and femto node can utilize similar channel structures, and thus, tone selecting module 206 can utilize preconfigured channel configurations to determine channel regions of related RS tones. In another example, tone selecting module 206 can receive the channel partitioning information from one or more network components, the macrocell base station and/or femto node, etc. The tone selecting module 206 can obtain information about resource partitioning between the macrocell base station and femto node, which the tone selecting module 206 can use to determine the interference caused to RS and data transmission from the femto node to the device. For example, the resource partitioning information can include determining which subframes are used by the macrocell base station to transmit data and/or control data, which subframes are used as multimedia broadcast over single frequency network (MBSFN) subframes or almost blank subframes (ABS) by macrocell base stations, and/or the like.

In either case, in an example, tone selecting module 206 can at least determine to select the RS tones that are in a broadcast channel region (e.g., PBCH) to use for performing channel estimation for at least a broadcast channel of the femto node. For example, interference can more easily be canceled over RS tones in the broadcast channel region since the decoded signal from the macrocell base station used to cancel interference is in the same broadcast channel region. Thus, the interference cancelation can be accurate in this region, and the RS tones of the femto node can be of a higher quality than other RS tones after the interference cancelation. In other examples, tone selecting module 206 can define different filtering parameters for selecting RS tones within certain channel regions (e.g., a set of filtering parameters for selecting RS tones in a broadcast channel region and a different set of filtering parameters for selecting RS tones in a data channel region).

Moreover, for example, tone selecting module 206 can additionally obtain a power of the one or more RS tones. In one example, tone selecting module 206 can compute P1, which can be a power of one or more RS tones as received in a control channel region (e.g., physical downlink control channel (PDCCH)), P2, which can be a power of one or more RS tones as received in a data channel region (e.g., physical downlink shared channel (PDSCH)) but not a broadcast channel region (e.g., PBCH), and P, which can be a power of one or more RS tones as received in a data channel region (e.g., PDSCH) and in the PBCH region. In this example, tone selecting module 206 can select RS tones in the control channel region if P1−P is less than a threshold level (e.g., three or six decibels (dB)). Also, in this example, tone selecting module 206 can select RS tones in the data region if P2−P is less than a threshold level (e.g., three or six dB).

Tone selecting module 206 can recompute P1, P2, and P when a base station signal is decoded and canceled and/or before performing interference cancelation. It is to be appreciated that P1 and P2 are separately computed since the control channel region may be lightly loaded by the macrocell base station and/or other base stations, such that the corresponding RS tones from the femto node may have a signal quality above a threshold. Alternately, the control channel region may be loaded but signals from the macrocell base station may be outside of a center frequency range (e.g., six resource blocks), and thus the RS tones of the femto node may similarly have a signal quality above a threshold.

In another example, tone selecting module 206 can select RS tones based on whether the RS tones of the femto node collide with those of the macrocell base station, which tone selecting module 206 can determine based on cell identifiers of the femto node and macrocell base station. In other examples, tone selecting module 206 can use other parameters, such as a frequency offset. In this example, the frequency offset can be received from one or more network components, and where the frequency offset is large (e.g., above a threshold), tone selecting module 206 can select the RS tones near the data or related channel of interest (e.g., in frequency and/or time) while including RS tones that are further away (e.g., based in part on a distance in the time domain) where the frequency offset is small.

In an additional example, tone selecting module 206 can similarly select RS tones based on a determined rate of channel variation of a wireless channel at the apparatus 200 where above, below, or at a threshold. For example, this can include using more RS tones that are separated (e.g., the in time domain or filtering such RS tones resulting in more averaging over time when the rate of variation is low, while using RS tones nearer to the data or related channel of interest (e.g., in frequency or time) or using filtering parameters that lead to less averaging over time when rate of variation is high. Moreover, for example, tone selecting module 206 can select different sets of RS tones for multiple different channel estimates by channel estimating module 208, and channel decoding module 210 can utilize the multiple channel estimates in decoding the broadcast channel of the femto node.

In further examples, tone selecting module 206 can determine a quality of the RS tones based on whether a signal is canceled from the RS tones by interference canceling module 204. In one example, an indication of such can be received from the interference canceling module 204. Tone selecting module 206 can assign a better quality to those RS tones over which a signal is canceled. In another example, tone selecting module 206 can determine a quality of the RS tones based on whether a signal is transmitted over the RS tones by other base stations. Such RS tones can be of lower quality than those over which signals are not transmitted by other base stations. In one example, tone selecting module 206 can determine whether other base stations transmit over the RS tones based on a resource partitioning thereof, a MBSFN/ABS configuration of the other base station, a received power comparison over the plurality of RS tones with the interference-canceled RS tones, interference canceled data tones, or other tones that are known to not have interference from the macrocell base station (e.g., null tones in the PBCH region of the macrocell base station, tones where the macrocell base station is not transmitting in a ABS/MBSFN configuration, null tones corresponding to reference signal of a second antenna port on first OFDM symbol of each subframe where the macrocell base station uses a single common reference signal (CRS) port, etc.), and/or the like.

In another example, tone weighting module 212 can utilize similar parameters described above to assign a weight to, or otherwise classify, the RS tones. In this example, tone weighting module 212 can assign weights as a function of the parameters, according to various thresholds, and/or the like. In a specific example, tone weighting module 212 can assign a highest available weight to RS tones from the femto node in the broadcast channel regions, a lower weight to RS tones in a data or control channel region according to the P1, P2, and/or P parameter values, frequency offset, rate of channel variation etc. Channel estimating module 208 can utilize the RS tones according to the assigned weight to determine the channel estimates. For example, channel estimating module 208 can apply the weight to the RS tones while averaging to obtain channel estimates from the RS tones. In one example, channel estimating module 208 can classify the RS tones according to weight (e.g., high quality, low quality, middle, quality, etc.), and can perform at least one channel estimate for RS tones having a similar classification. Channel estimating module 208 can perform additional channel estimations for RS tones having different classifications, and channel decoding module 210 can decode the channel from the femto node using the multiple channel estimates.

In another example, where tone weighting module 212 classifies the RS tones, channel estimating module 208 can perform multiple channel estimates using different combinations of the classifications to derive a substantially accurate channel estimate. In one example, tone weighting module 212 can classify RS tones from the femto node into at least two groups: a more desirable group and a less desirable group (e.g., based on quality of the RS tones). In this example, channel estimating module 208 can attempt to estimate the channel, and channel decoding module 210 can decode the channel using the estimate. If the data decoding is successful (e.g., a cyclic redundancy check (CRC) passes) then it is likely that the channel estimation was reasonably accurate. If the channel estimation is not determined to be substantially accurate based on the verification, channel estimating module 208 can perform an additional channel estimate using tones from the more desirable group along with one or more tones from the less desirable group, and proceed to data decoding and so on, until at least one of a channel estimation is achieved that results in successful decoding, or other stopping criteria are met, such as attempting a certain number of combinations of channel estimates.

For example, for four RS tones, where two are in the more desirable group and two are in the less desirable group, the channel estimating module 208 can attempt channel estimation with the two from the more desirable group alone. If the channel estimation is not substantially accurate, the channel estimating module 208 can attempt channel estimation with the two from the more desirable group, and one tone from the less desirable group. If the channel estimation is still not substantially accurate, the channel estimating module 208 can attempt channel estimation with the two from the more desirable group, and the other tone from the less desirable group. If the channel estimation is still not substantially accurate, the channel estimating module 208 can attempt channel estimation with the two from the more desirable group, and the two tones from the less desirable group, etc.

In another example, channel decoding module 210 can also use an interference estimate in addition to a channel estimate to decode the channel. In one example, interference estimating module 214 can perform the interference estimate using RS tones on the resource block in which the data is located, as it can be assumed that the RS tones in that resource block see the same interference as the data. When canceling interference (e.g., PBCH cancelation and/or CRS cancelation), however, the data channel region may not have interference from the macrocell base station. Thus, some RS tones may continue to be interfered from the data of the macrocell base station that is not canceled, while other RS tones may not be interfered by the macrocell base station. In this regard, interference estimating module 214 can determine to estimate interference over at least a subset of RS tones that are not interfered by the macrocell base station. For example, the interference estimating module 214 can identify such RS tones as described with respect to tone selecting module 206 (e.g., resource partitioning information, MBSFN/ABS configuration, power measurements, etc.). In addition, interference estimating module 214 can perform interference estimates in part by using the covariance of data tones directly. The covariance of the data tones can provide the signal plus noise power. Since PBCH is designed to be decoded at low SNR, however, when the SNR is low, the signal power is negligible and hence interference estimate can be substantially equal to the desired noise power. When the SNR is high, PBCH can likely be decoded even with incorrect estimate of interference.

Moreover, for example, interference estimating module 214 can determine at least a subset of the plurality of RS tones for performing interference estimation based on at least one of a primary synchronization signal (PSS) received from the femto node or macrocell base station, a resource partitioning between the macrocell base station and the femto node, whether a subframe over which the plurality of RS tones are received is a MBSFN/ABS subframe, etc. Moreover, for example, interference estimating module 214 can determine the RS tones based in part on a received power comparison between at least one of the plurality of RS tones and an interference-canceled tone or data tone, or other tones that are known to not have interference from the macrocell base station (e.g., null tones in the PBCH region of the macrocell base station, tones where the macrocell base station is not transmitting in a ABS/MBSFN configuration, etc.). In one example, a location of such tones can be received from the macrocell base station, from one or more network components, from a hardcoding or configuration, and/or the like. In another example, both interference estimating via RS tones and data tones can be used by channel decoding module 210 to decode the broadcast channel in addition or alternatively to the channel estimates.

Figure 3:
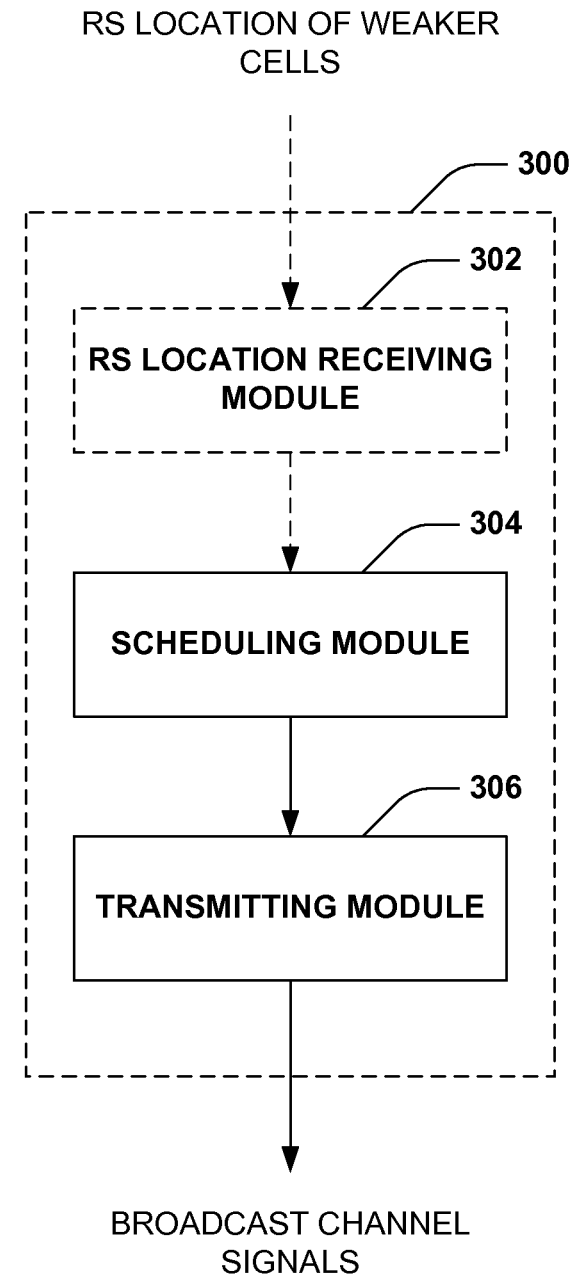
FIG. 3 is a block diagram of an aspect of a system for muting reference signal (RS) tones used by a femto node.

FIG. 3 illustrates an example apparatus 300 for transmitting broadcast signals. Apparatus 300 can be a femto node, macrocell base station, or other base stations (e.g., base stations 104 and 106), that can communicate with devices in a wireless network to provide access thereto. Apparatus 300 can include an optional RS location receiving module 302 for obtaining a RS locations used by weaker cells, a scheduling module 304 for scheduling resources for transmitting one or more channels using one or more signals, and a transmitting module 306 for transmitting data according to the scheduling.

According to an example, scheduling module 304 can determine whether to mute (e.g., not schedule transmissions over) tones utilized for transmitting broadcast channel signals by femto nodes or other base stations to allow for decoding such channels without interference at devices. This can be done over substantially all or at least a subset of transmission opportunities within the broadcast channel region. In another example, RS location receiving module 302 can obtain information regarding RS tone locations over which one or more neighboring femto nodes transmit RSs in the broadcast channel region, and scheduling module 304 can then mute some portion of the RS tone locations.

For example, RS location receiving module 302 can identify RS tones from the femto node or other network components in a subset of subframes, and can determine a location of the tones in frequency and/or time. In any case, scheduling module 304 can mute tones in the location of at least a subsequent subframe. For example, in an orthogonal frequency division multiplexing (OFDM) configuration, RS location receiving module 302 can identify the tone locations within one or more OFDM symbols in a given subframe (e.g., based on signals received from the femto node, an indicated configuration, etc.), and scheduling module 304 can mute the tone locations in the OFDM symbols of a subsequent subframe. In another example, the RS location receiving module 302 can determine locations of the tones in subsequent subframes based on the determined location and one or more hopping patterns used by the femto node (e.g., which can be indicated to or otherwise known by the apparatus 300). In any case, transmitting module 306 can transmit over tones scheduled by scheduling module 304, while refraining from transmitting over tone locations muted by scheduling module 304. In one example, the muting can further include muting RS tones over a portion of resource blocks in a subframe (e.g., a center six or other number of resource blocks on a subset of OFDM symbols that correspond to the RS tones).

Figure 4:
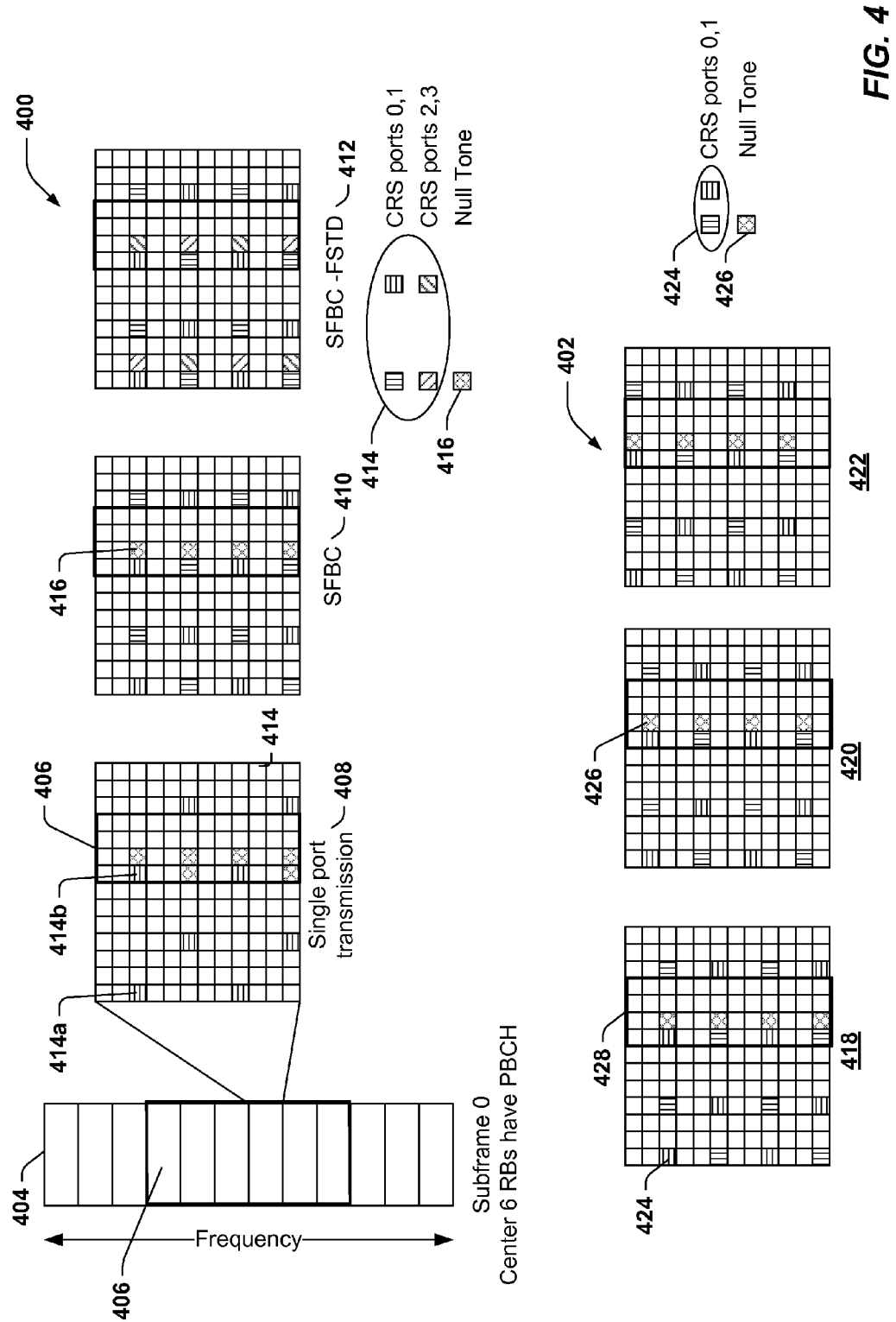
FIG. 4 is a block diagram of example frame structures.

FIG. 4 is a diagram illustrating example frame structures 400 and 402 including resource element (e.g., tone) allocations for CRS and PBCH. It is to be appreciated, however, that other frame structure can be used in aspects described herein. The PBCH payload can include 24 bits, with a tail-biting convolution code with a 1/3 rate. The payload can change every 40 milliseconds (ms) (e.g., changing with single frequency network (SFN) increments), and four redundancy versions (RV) can be transmitted with the 40 ms. RV detection provides two least significant bits (LSB) of SFN.

Within a subframe 404, the central resource blocks (e.g., center 6 resource blocks (RB)) can be used for PBCH 406 transmissions. Example frame structures 400 depict various frame structures that differ based in part on the number of CRSs ports used in communications. For example, a single port transmission 408 may include one CRS 414 port, a space frequency block coding (SFBC) 410 may include use two CRS 414 ports, and a SFBC frequency shift time diversity (FSTD) 412 may use four CRS 414 ports. Additionally, resource elements (RE) may be used for communication of the PBCH 406, and as null tones 416.

As noted above, during interference cancelation, different RSs may experience different levels of interference depending on a number of factors. In one aspect, where a macrocell base station and femto node completely collide, substantially all RSs may experience similar levels of interference. For instance, if there are two cells that have RSs 414 that completely collide, when interference cancelation is performed, the PBCH and RS of the stronger cell are canceled equally for substantially all RS 414 tones of the weaker cell, and as such, substantially all RSs 414 may experience similar reduced interference.

In another aspect, a strong cell may provide a blank or almost blank subframe, such as during resource partitioning, and may be configured such that the two cells RSs do not collide. As such, before PBCH and RS interference cancelation of the strong cell, RS 414 of the weaker cell can be clean in the control region and the non-PBCH region (e.g., outside of PBCH region 406), but may see interference from the PBCH of the stronger cell in the PBCH region (e.g., unless the CRS of weaker cell happens to be in the null tones 416 of the stronger cell). After interference cancelation of the strong cell PBCH, substantially all weak cell RSs 414 may experience similar reduced interference.

In another aspect, a strong cell may transmit using a regular subframe including data and may be configured such that the two cells RSs do not collide. As such, before PBCH and RS interference cancelation of the strong cell, the RS 414 of the weaker cell may experience strong interference in the control region, the data region, and the PBCH region 406. Although, in the PBCH region 406, the RSs 414b may not experience high interference if RS 414b of weaker cell happens to be in the null tones 416 of stronger cell. After PBCH IC and RS IC, RS 414b in the PBCH region experiences relatively less interference from the strong cell than RS 414a in data and control region.

In one aspect, where frequency offset information for the strong and weak cells is not available, the channel information from RS tones on the different OFDM symbols may not be matched with the channel in PBCH region. In such an aspect, use of RS tones 414b close to the PBCH region and/or in the PBCH region may result in more effective channel estimation than using all RS 414 tones. Thus, as described herein, a device can associate RS tones 414b with a higher quality and can select these tones for performing channel estimation. In other examples, the device can assign RS tones 414b higher weight, a more desirable classification, etc., based on determining a quality of the RS tones 414b (e.g., based on resource partitioning, a received power of the tones, etc.).

In example frame structures 402, different RB designs 418, 420, and 422 may differ in CRS 424 and null tone 426 positioning, with respect to the PBCH 428. In operation, differing CRS 424 placement may result in differing levels of interference observed after PBCH interference cancelation and RS interference cancelation. For example, if both a strong cell and a weak cell are using RB 418 design, then the RSs collide and interference cancelation allows the weak cell RS to be recovered with minimal interference. By contrast, if a strong cell and a weak cell are using different RB designs (e.g., 418 and 420), then the weak cell RS tones may experience different levels of interference, as discussed above. Thus, a device can select, weight, classify, etc. tones for using in channel estimation.

FIGS. 5-8 illustrate example methodologies relating to decoding communications from one or more base stations. While, for purposes of simplicity of explanation, the methodologies are shown and described as a series of acts, it is to be understood and appreciated that the methodologies are not limited by the order of acts, as some acts may, in accordance with one or more embodiments, occur concurrently with other acts and/or in different orders from that shown and described herein. For example, it is to be appreciated that a methodology could alternatively be represented as a series of interrelated states or events, such as in a state diagram. Moreover, not all illustrated acts may be required to implement a methodology in accordance with one or more embodiments.

Figure 5:
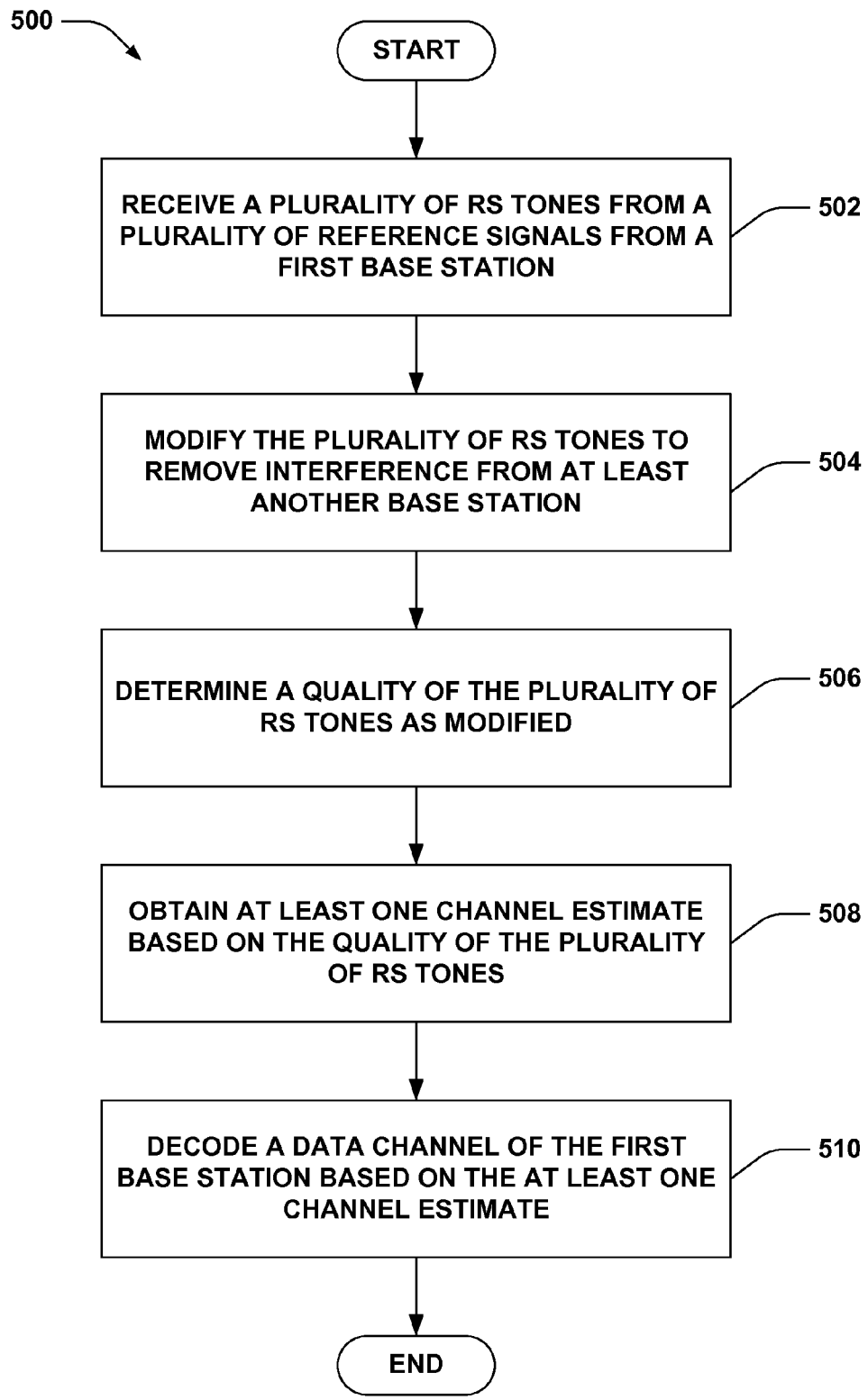
FIG. 5 is a flow chart of an aspect of a methodology for decoding a broadcast channel based on determining RS tone quality.

FIG. 5 depicts an example methodology 500 for decoding a broadcast channel. At 502, a plurality of RS tones from a plurality of RSs can be received from a first base station. For example, the first base station can transmit one or more RSs to facilitate channel estimation and decoding, and the RSs can be received over a related frequency spectrum. In addition, as described, the first base station can utilize OFDM or similar multiplexing over frequency and time to yield a plurality of tones over which the RSs can be transmitted in a given subframe.

At 504, the plurality of RS tones can be modified to remove interference from at least another base station. Interference cancelation can be applied to the tones in part by obtaining RS tones related to the at least another base station and decoding a broadcast channel thereof based on the RS tones. The signals from the at least another base station can then be canceled by removing the decoded broadcast channel of the at least another base station from the received signals (e.g., including the received RS tones thereof).

At 506, a quality of the RS tones as modified can be determined. This can include, for example, obtaining a SINR of the RS tones, inferring a quality based on channel partitioning, RS power, frequency offset, etc., as described above. In one specific example, the quality of the RS tones can be determined by computing or otherwise determining a power thereof, and comparing the powers based on a location of the RS tones within one or more channel regions to determine whether the RS tones are of sufficient quality for channel estimation.

At 508, at least one channel estimate can be obtained based on the quality of the plurality of RS tones. RS tones of a quality at least at a threshold level can be utilized to estimate the channel. As described, RS tones in a broadcast channel region can be associated with a high quality sufficient to utilize the RS tones in estimating the channel since a level of interference is readily attainable, such as to allow for substantially accurate interference cancelation. Additional RS tones can be associated with a high enough quality, as well as based on the considerations described above.

At 510, a data channel of the first base station can be decoded based on the at least one channel estimate. Since interference can vary across RS tones, using RS tones of a sufficient quality allows for improved channel estimating. In addition, interference estimates can be performed over the RS tones to assist in decoding the broadcast channel. The data channel can correspond to a broadcast channel, in one example.

Figure 6:
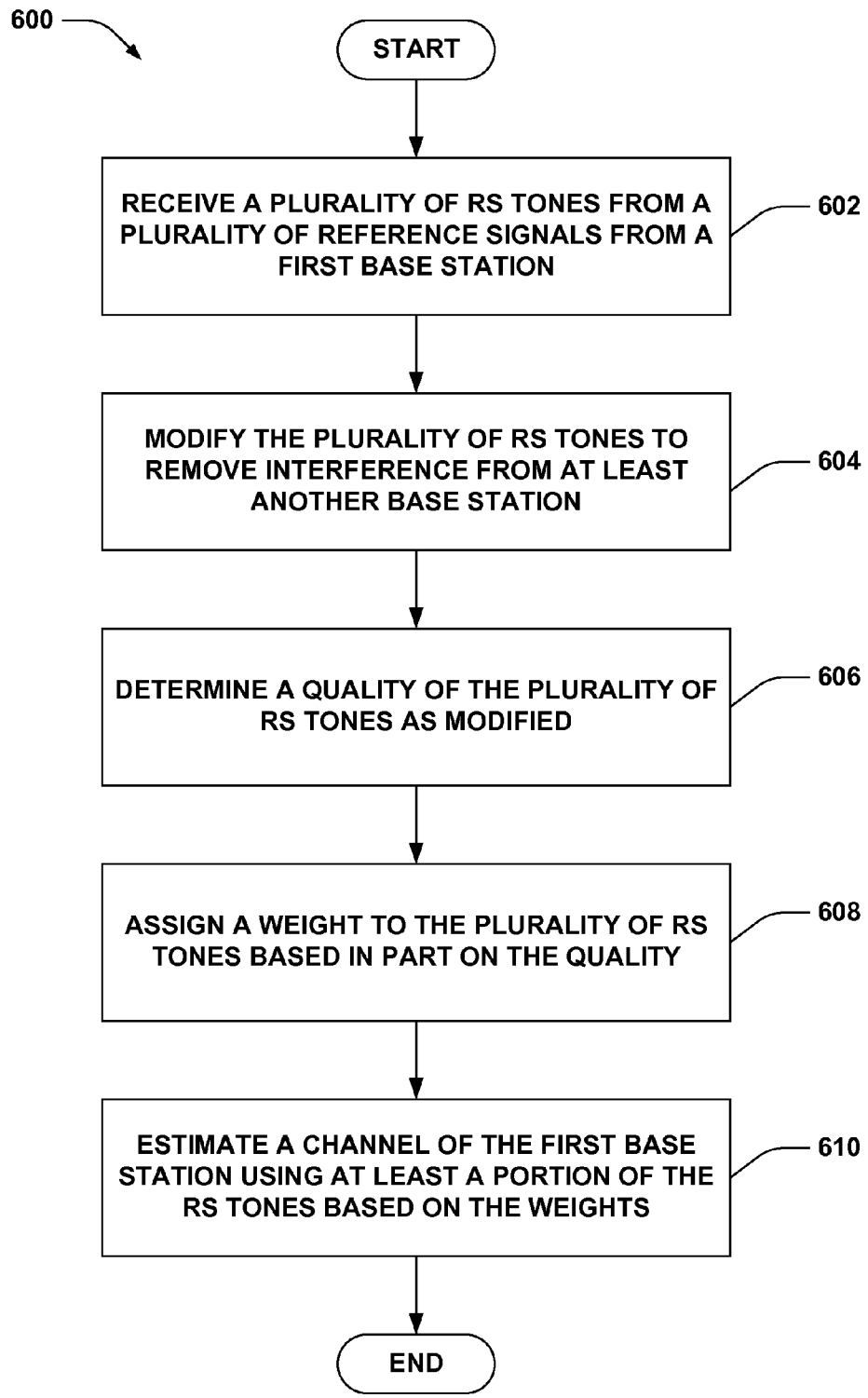
FIG. 6 is a flow chart of an aspect of weighting RS tones for decoding a channel.

FIG. 6 depicts an example methodology 600 for decoding a broadcast channel. At 602, a plurality of RS tones from a plurality of RSs can be received from a first base station. For example, the first base station can transmit one or more RSs to facilitate channel estimation and decoding, and the RSs can be received over a related frequency spectrum. In addition, as described, the first base station can utilize OFDM or similar multiplexing over frequency and time to yield a plurality of tones over which the RSs can be transmitted in a given subframe.

At 604, the plurality of RS tones can be modified to remove interference from at least another base station. Interference cancelation can be applied to the tones in part by obtaining RS tones related to the at least another base station and decoding a broadcast channel thereof based on the RS tones. The signals from the at least another base station can then be canceled by removing the decoded broadcast channel of the at least another base station from the received signals (e.g., including the received RS tones thereof).

At 606, a quality of the RS tones as modified can be determined. This can include, for example, obtaining a SINR of the RS tones, inferring a quality based on channel partitioning, RS power, frequency offset, etc., as described above. In one specific example, the quality of the RS tones can be determined by computing or otherwise determining a power thereof, and comparing the powers based on a location of the RS tones within one or more channel regions to determine whether the RS tones are of sufficient quality for channel estimation.

At 608, a weight can be assigned to the plurality of RS tones based in part on the quality. In one example, the assigned weight can be a function of the quality of the RS tones. As described, RS tones in a broadcast channel region can be assigned a higher weight at least since a level of interference is readily attainable in this region such to allow for substantially accurate interference cancelation. Additional RS tones can be assigned weights based on the considerations described above.

At 610, a channel of the first base station can be estimated using at least a portion of the RS tones based on the weights. Since interference can vary across RS tones, as described, using RS tones with similar weights to estimate the channel and/or weighting the estimate based on the weights of the RS tones used can provide a more accurate estimation.

Figure 7:
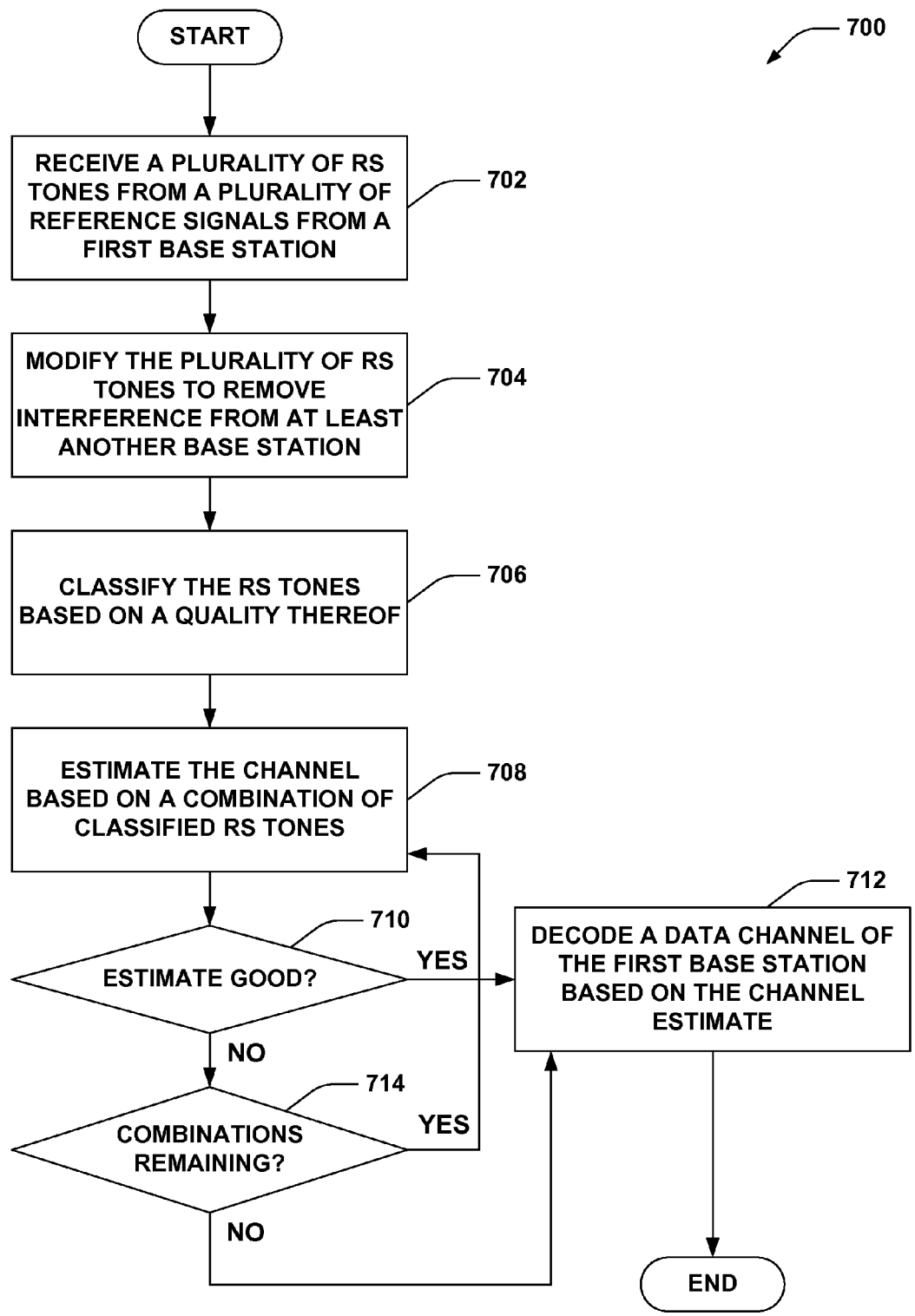
FIG. 7 is a flow chart of an aspect of a methodology for classifying RS tones for decoding a channel.

FIG. 7 shows an example methodology 700 for estimating a channel using combinations of received RS tones. At 702, a plurality of RS tones can be received from a plurality of reference signals from a first base station. For example, the first base station can transmit one or more RSs to facilitate channel estimation and decoding, and the RSs can be received over a related frequency spectrum. In addition, as described, the first base station can utilize OFDM or similar multiplexing over frequency and time to yield a plurality of tones over which the RSs can be transmitted in a given subframe.

At 704, the plurality of RS tones can be modified to remove interference from at least another base station. Interference cancelation can be applied to the tones in part by obtaining RS tones related to the at least another base station and decoding a broadcast channel thereof based on the RS tones. The signals from the at least another base station can then be canceled by removing the decoded broadcast channel of the at least another base station from the received signals (e.g., including the received RS tones thereof).

At 706, the RS tones can be classified based on a quality thereof. The quality can be determined as described (e.g., based on obtaining a SINR of the RS tones, inferring a quality based on channel partitioning, RS power, frequency offset, etc.). RS tones can be assigned a classification based on comparing the determined qualities to certain thresholds. In one classification, the RS tones can be classified into a group of more desirable tones and a group of less desirable tones, as described.

At 708, the channel can be estimated based on a combination of classified RS tones. For example, the combination can be determined based on quality (e.g., a combination of the more desirable tones). The estimate can be verified at 710 to determine whether the estimate is good; for example, this can be based on comparing the estimate to a CRC to determine whether the estimate is at least at a threshold accuracy. If so, at 712, a data channel of the first base station can be decoded based on the channel estimate.

If the estimate is not good (e.g., not at the threshold accuracy) at 710, it can be determined at 714 whether combinations remain. For example, assuming four possible RS tones, with two having a more desirable classification, there are four possible combinations to analyze: (i) using the two desirable tones; (ii) using the two tones with one less desirable tone; (iii) using the two tones with the other less desirable tones; or (iv) using all four tones, etc. If combinations remain, the channel can be estimated based on another combination of classified RS tones at 708. If no combinations remain, a broadcast channel of the first base station can be decoded at 712 based on at least one of the channel estimates.

Figure 8:
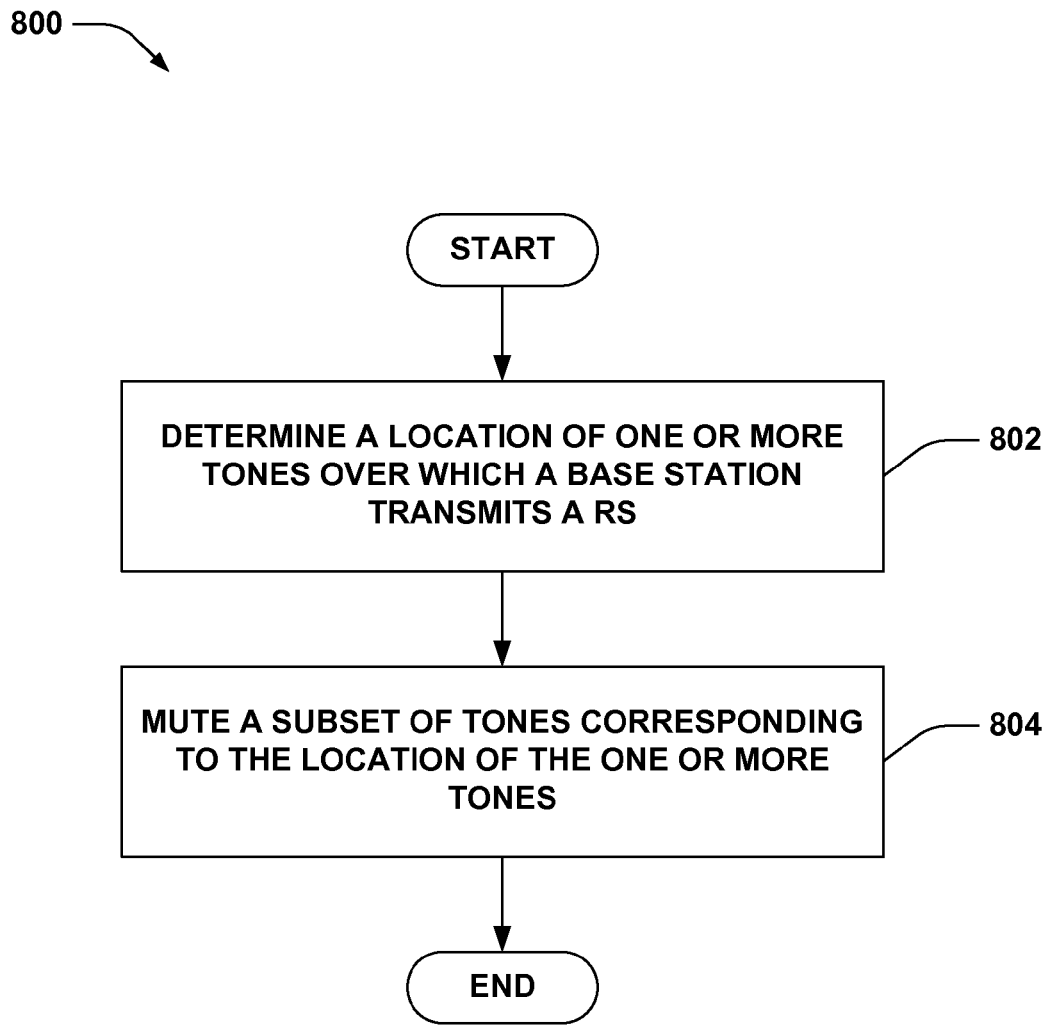
FIG. 8 is a flow chart of an aspect of a methodology for muting RS tones used by a femto node.

FIG. 8 illustrates an example methodology 800 for muting RS tones used by a femto node. At 802, a location one or more tones over which a base station transmits an RS can be determined. This can include receiving such information from the base station (e.g., over a backhaul link), a mobile device, or another network component, inferring the tones based in part on receiving the RSs from the base station in at least a subset of one or more other subframes, etc.

At 804, a subset of tones corresponding to the location of the one or more tones can be muted. For example, a scheduler can ensure that no signals are scheduled for transmission over the muted tones. This can be in a subsequent subframe, in substantially all subframes, and/or the like, to allow devices to properly decode signals from the base station.

It will be appreciated that, in accordance with one or more aspects described herein, inferences can be made regarding determining a set of RS tones for estimating a channel, and/or the like, as described. As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 9:
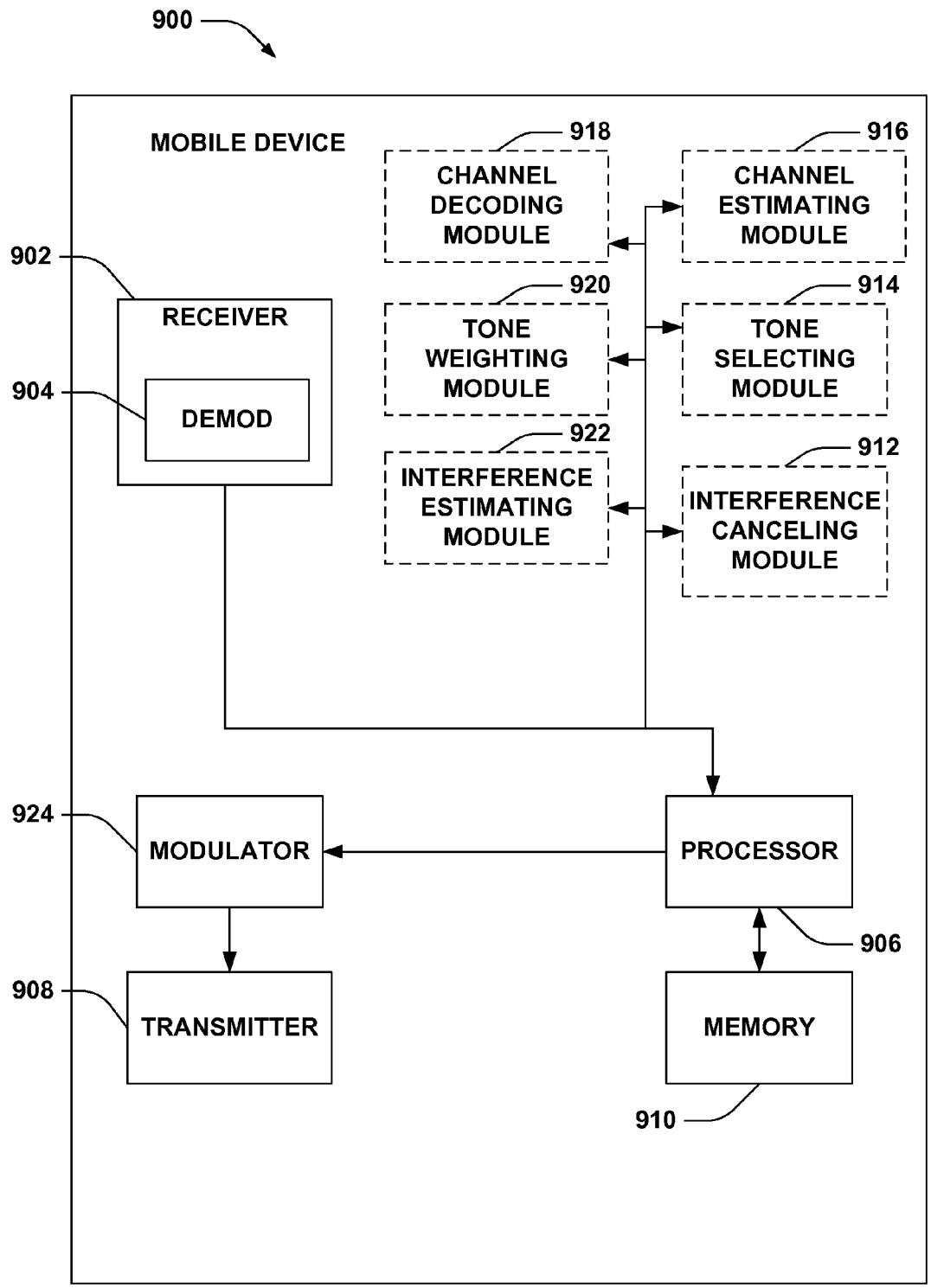
FIG. 9 is a block diagram of an aspect of an example mobile device in accordance with aspects described herein.

FIG. 9 is an illustration of a mobile device 900 that facilitates decoding a channel using one or more RS tones. Mobile device 900 comprises a receiver 902 that receives a signal from, for instance, a receive antenna (not shown), performs typical actions on (e.g., filters, amplifies, downconverts, etc.) the received signal, and digitizes the conditioned signal to obtain samples. Receiver 902 can comprise a demodulator 904 that can demodulate received symbols and provide them to a processor 906 for channel estimation. Processor 906 can be a processor dedicated to analyzing information received by receiver 902 and/or generating information for transmission by a transmitter 908, a processor that controls one or more components of mobile device 900, and/or a processor that both analyzes information received by receiver 902, generates information for transmission by transmitter 908, and controls one or more components of mobile device 900.

Mobile device 900 can additionally comprise memory 910 that is operatively coupled to processor 906 and that can store data to be transmitted, received data, information related to available channels, data associated with analyzed signal and/or interference strength, information related to an assigned channel, power, rate, or the like, and any other suitable information for estimating a channel and communicating via the channel. Memory 910 can additionally store protocols and/or algorithms associated with estimating and/or utilizing a channel (e.g., performance based, capacity based, etc.).

It will be appreciated that the data store (e.g., memory 910) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 910 of the subject systems and methods is intended to comprise, without being limited to, these and any other suitable types of memory.

In one example, receiver 902 can be similar to a receiving module 202. Processor 906 can further be optionally operatively coupled to a interference canceling module 912, which can be similar to interference canceling module 204, a tone selecting module 914, which can be similar to tone selecting module 206, and/or a channel estimating module 916, which can be similar to channel estimating module 208. Processor 906 can also be optionally coupled to a channel decoding module 918, which can be similar to channel decoding module 210, a tone weighting module 920, which can be similar to tone weighting module 212, and/or an interference estimating module 922, which can be similar to interference estimating module 214.

Mobile device 900 still further comprises a modulator 924 that modulates signals for transmission by transmitter 908 to, for instance, a base station, another mobile device, etc. Moreover, for example, mobile device 900 can comprise multiple transmitters 908 for multiple network interfaces, as described. Although depicted as being separate from the processor 906, it is to be appreciated that the interference canceling module 912, tone selecting module 914, channel estimating module 916, channel decoding module 918, tone weighting module 920, interference estimating module 922, demodulator 904, and/or modulator 924 can be part of the processor 906 or multiple processors (not shown)), and/or stored as instructions in memory 910 for execution by processor 906.

Figure 10:
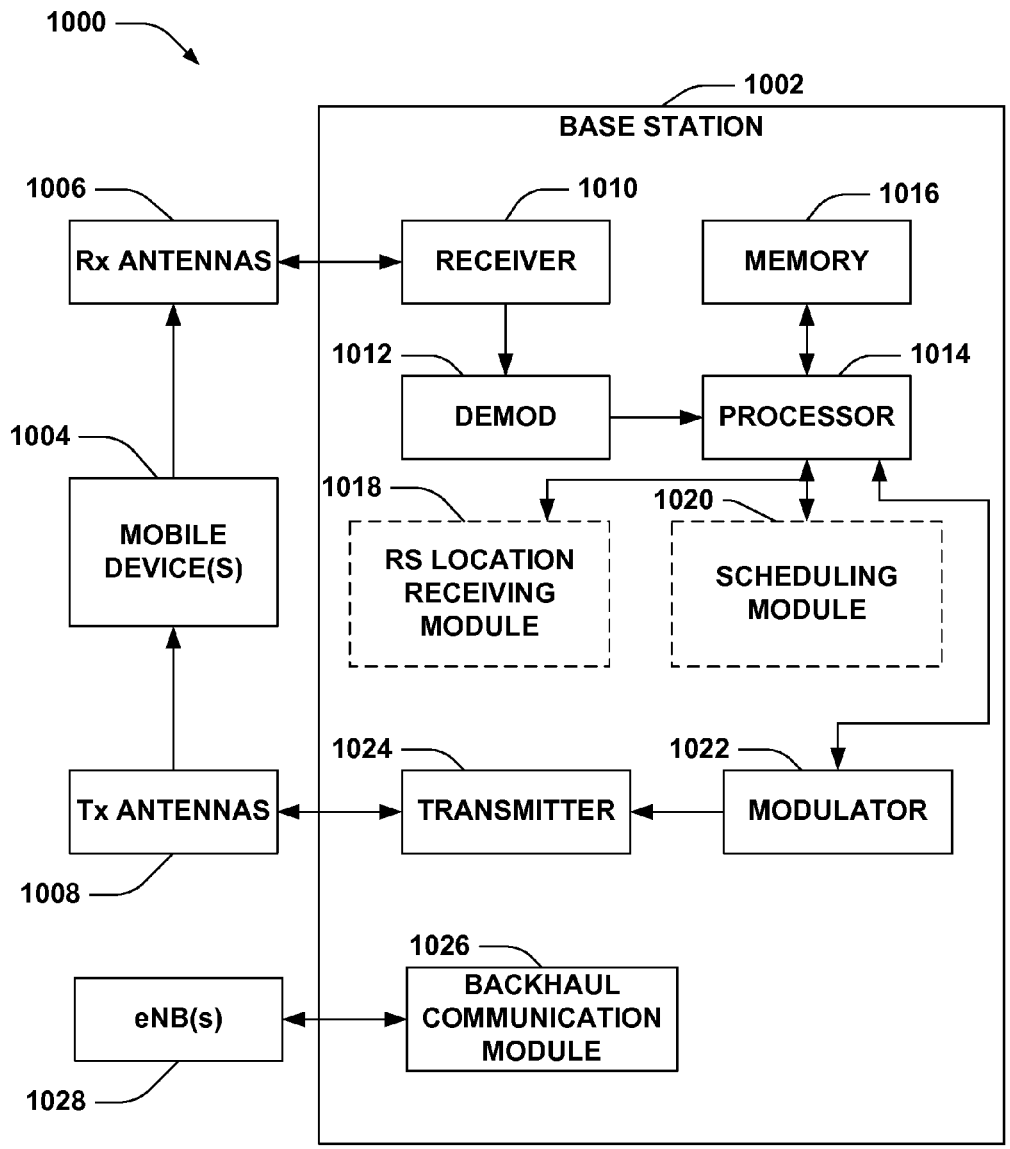
FIG. 10 is a block diagram of an aspect of an example system in accordance with aspects described herein.

FIG. 10 is an illustration of a system 1000 that facilitates communicating with one or more devices using wireless communications. System 1000 comprises a base station 1002, which can be substantially any base station (e.g., a low power base station, such as a femto node, pico node, etc., mobile base station . . . ), a relay, etc., having a receiver 1010 that receives signal(s) from one or more mobile devices 1004 through a plurality of receive antennas 1006 (e.g., which can be of multiple network technologies, as described), and a transmitter 1024 that transmits to the one or more mobile devices 1004 through a plurality of transmit antennas 1008 (e.g., which can be of multiple network technologies, as described). In addition, in one example, transmitter 1024 can transmit to the mobile devices 1004 over a wired front link. Receiver 1010 can receive information from one or more receive antennas 1006 and is operatively associated with a demodulator 1012 that demodulates received information. In addition, in an example, receiver 1010 can receive from a wired backhaul link. Moreover, though shown as separate antennas, it is to be appreciated that at least one transmit antenna 1008 can be combined with at least one receive antenna 1006 as a single antenna.

Demodulated symbols are analyzed by a processor 1014 that can be similar to the processor described above with regard to FIG. 9, and which is coupled to a memory 1016 that stores information related to estimating a signal (e.g., pilot) strength and/or interference strength, data to be transmitted to or received from mobile device(s) 1004 (or a disparate base station (not shown)), and/or any other suitable information related to performing the various actions and functions set forth herein.

Processor 1014 is further optionally coupled to a RS location receiving module 1018, which can be similar to RS location receiving module 302, and/or a scheduling module 1020, which can be similar to scheduling module 304. Furthermore, transmitter 1024 can be similar to transmitting module 306. Moreover, for example, processor 1014 can modulate signals to be transmitted using modulator 1022, and transmit modulated signals using the transmitter 1024. Transmitter 1024 can transmit signals to mobile devices 1004 over Tx antennas 1008.

In addition, base station 1002 can include a backhaul communication module 1026 for communicating with one or more eNBs 1028 over a backhaul interface. For example, backhaul communication module 1026 can communicate with the eNBs 1028 over a wired or wireless backhaul link using one or more backhaul interfaces (e.g., X2 interface in LTE). Where the backhaul link is wireless for example, it is to be appreciated that base station 1002 can utilize Rx antennas 1006 and receiver 1010 to receive communications from eNBs 1028, and/or Tx antennas 1008 and transmitter 1024 to communicate signals to eNBs 1028.

Furthermore, although depicted as being separate from the processor 1014, it is to be appreciated that the RS location receiving module 1018, scheduling module 1020, backhaul communication module 1026, demodulator 1012, and/or modulator 1022 can be part of the processor 1014 or multiple processors (not shown), and/or stored as instructions in memory 1016 for execution by processor 1014.

Figure 11:
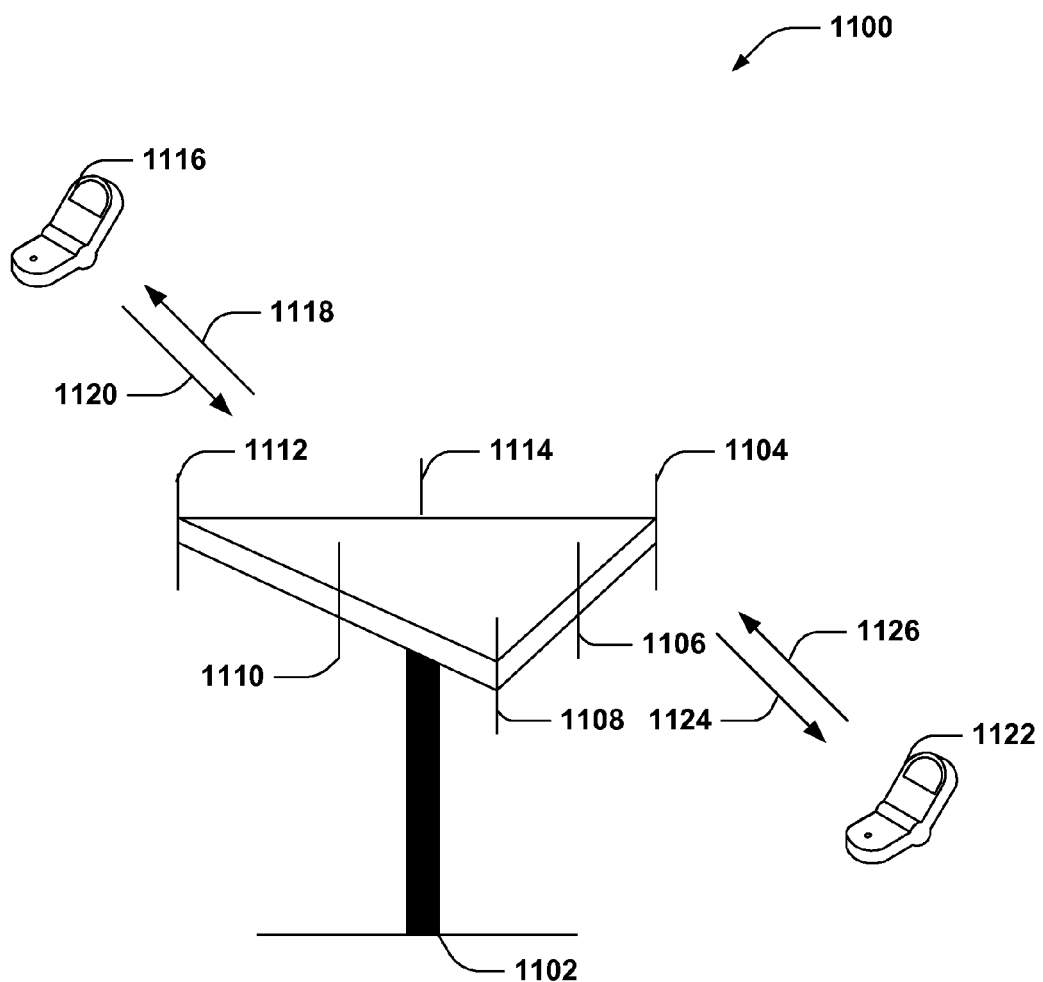
FIG. 11 is a block diagram of an aspect of a wireless communication system in accordance with various aspects set forth herein.

FIG. 11 illustrates a wireless communication system 1100 in accordance with various embodiments presented herein. System 1100 comprises a base station 1102 that can include multiple antenna groups. For example, one antenna group can include antennas 1104 and 1106, another group can comprise antennas 1108 and 1110, and an additional group can include antennas 1112 and 1114. Two antennas are illustrated for each antenna group; however, more or fewer antennas can be utilized for each group. Base station 1102 can additionally include a transmitter chain and a receiver chain, each of which can in turn comprise a plurality of components or modules associated with signal transmission and reception (e.g., processors, modulators, multiplexers, demodulators, demultiplexers, antennas, etc.), as is appreciated.

Base station 1102 can communicate with one or more mobile devices such as mobile device 1116 and mobile device 1122; however, it is to be appreciated that base station 1102 can communicate with substantially any number of mobile devices similar to mobile devices 1116 and 1122. Mobile devices 1116 and 1122 can be, for example, cellular phones, smart phones, laptops, handheld communication devices, handheld computing devices, satellite radios, global positioning systems, PDAs, and/or any other suitable device for communicating over wireless communication system 1100. As depicted, mobile device 1116 is in communication with antennas 1112 and 1114, where antennas 1112 and 1114 transmit information to mobile device 1116 over a forward link 1118 and receive information from mobile device 1116 over a reverse link 1120. Moreover, mobile device 1122 is in communication with antennas 1104 and 1106, where antennas 1104 and 1106 transmit information to mobile device 1122 over a forward link 1124 and receive information from mobile device 1122 over a reverse link 1126. In a frequency division duplex (FDD) system, forward link 1118 can utilize a different frequency band than that used by reverse link 1120, and forward link 1124 can employ a different frequency band than that employed by reverse link 1126, for example. Further, in a time division duplex (TDD) system, forward link 1118 and reverse link 1120 can utilize a common frequency band and forward link 1124 and reverse link 1126 can utilize a common frequency band.

Each group of antennas and/or the area in which they are designated to communicate can be referred to as a sector of base station 1102. For example, antenna groups can be designed to communicate to mobile devices in a sector of the areas covered by base station 1102. In communication over forward links 1118 and 1124, the transmitting antennas of base station 1102 can utilize beamforming to improve signal-to-noise ratio of forward links 1118 and 1124 for mobile devices 1116 and 1122. Also, while base station 1102 utilizes beamforming to transmit to mobile devices 1116 and 1122 scattered randomly through an associated coverage, mobile devices in neighboring cells can be subject to less interference as compared to a base station transmitting through a single antenna to all its mobile devices. Moreover, mobile devices 1116 and 1122 can communicate directly with one another using a peer-to-peer or ad hoc technology as depicted. According to an example, system 1100 can be a multiple-input multiple-output (MIMO) communication system or similar system that allows assigning multiple carriers between base station 1102 and mobile devices 1116 and/or 1122. For example, base station 1102 can correspond to apparatus and/or one or more femto nodes described herein, and mobile devices 1116 and 1122 can correspond to apparatus 200 and can thus decode broadcast channels from base station 1102 or in part by canceling interference from base station 1102.

Figure 12:
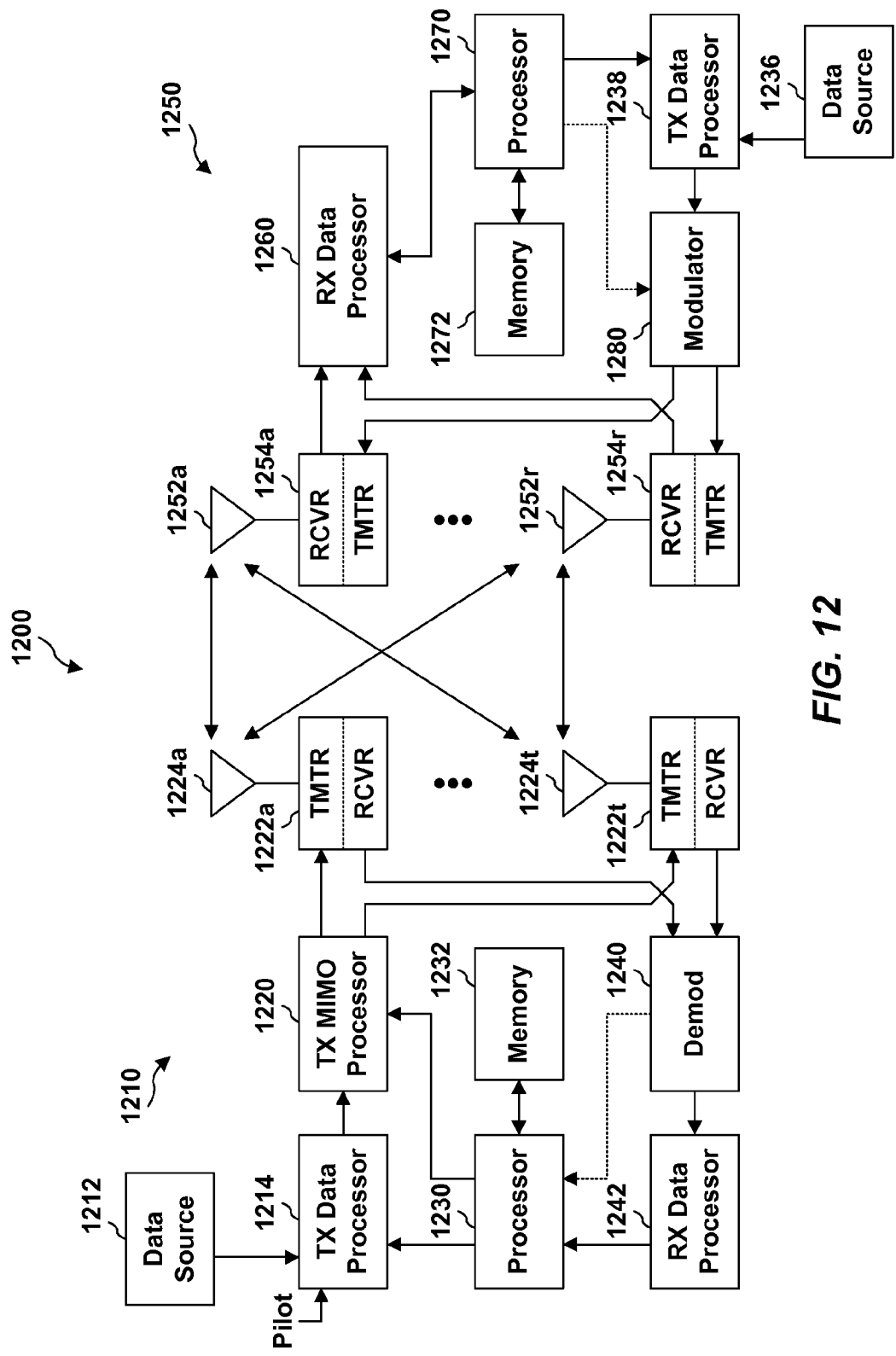
FIG. 12 is a schematic block diagram of an aspect of a wireless network environment that can be employed in conjunction with the various systems and methods described herein.

FIG. 12 shows an example wireless communication system 1200. The wireless communication system 1200 depicts one base station 1210 and one mobile device 1250 for sake of brevity. However, it is to be appreciated that system 1200 can include more than one base station and/or more than one mobile device, wherein additional base stations and/or mobile devices can be substantially similar or different from example base station 1210 and mobile device 1250 described below. In addition, it is to be appreciated that base station 1210 and/or mobile device 1250 can employ the systems (FIGS. 1-3, 10, and 11), frame structures (FIG. 4), methods (FIGS. 5-8), and/or mobile devices (FIG. 9) described herein to facilitate wireless communication there between. For example, components or functions of the systems and/or methods described herein can be part of a memory 1232 and/or 1272 or processors 1230 and/or 1270 described below, and/or can be executed by processors 1230 and/or 1270 to perform the disclosed functions.

At base station 1210, traffic data for a number of data streams is provided from a data source 1212 to a transmit (TX) data processor 1214. According to an example, each data stream can be transmitted over a respective antenna. TX data processor 1214 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at mobile device 1250 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1230.

The modulation symbols for the data streams can be provided to a TX MIMO processor 1220, which can further process the modulation symbols (e.g., for OFDM). TX MIMO processor 1220 then provides $N_T$ modulation symbol streams to $N_T$ transmitters (TMTR) 1222a through 1222t. In various embodiments, TX MIMO processor 1220 applies beamforming weights to the symbols of the data streams and to the antenna from which the symbol is being transmitted.

Each transmitter 1222 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1222a through 1222t are transmitted from $N_T$ antennas 1224a through 1224t, respectively.

At mobile device 1250, the transmitted modulated signals are received by $N_R$ antennas 1252a through 1252r and the received signal from each antenna 1252 is provided to a respective receiver (RCVR) 1254a through 1254r. Each receiver 1254 conditions (e.g., filters, amplifies, and downconverts) a respective signal, digitizes the conditioned signal to provide samples, and further processes the samples to provide a corresponding "received" symbol stream.

An RX data processor 1260 can receive and process the $N_R$ received symbol streams from $N_R$ receivers 1254 based on a particular receiver processing technique to provide $N_T$ "detected" symbol streams. RX data processor 1260 can demodulate, deinterleave, and decode each detected symbol stream to recover the traffic data for the data stream. The processing by RX data processor 1260 is complementary to that performed by TX MIMO processor 1220 and TX data processor 1214 at base station 1210.

The reverse link message can comprise various types of information regarding the communication link and/or the received data stream. The reverse link message can be processed by a TX data processor 1238, which also receives traffic data for a number of data streams from a data source 1236, modulated by a modulator 1280, conditioned by transmitters 1254a through 1254r, and transmitted back to base station 1210.

At base station 1210, the modulated signals from mobile device 1250 are received by antennas 1224, conditioned by receivers 1222, demodulated by a demodulator 1240, and processed by a RX data processor 1242 to extract the reverse link message transmitted by mobile device 1250. Further, processor 1230 can process the extracted message to determine which precoding matrix to use for determining the beamforming weights.

Processors 1230 and 1270 can direct (e.g., control, coordinate, manage, etc.) operation at base station 1210 and mobile device 1250, respectively. Respective processors 1230 and 1270 can be associated with memory 1232 and 1272 that store program codes and data. Moreover, processors 1230 and 1270 can assist in decoding broadcast channels by selecting, weighting, or classifying certain RS tones, muting RS tones used by femto nodes, and/or the like.

The various illustrative logics, logical blocks, modules, components, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal.

In one or more aspects, the functions, methods, or algorithms described may be implemented in hardware, software, firmware, or any combination thereof. If implemented in software, the functions may be stored or transmitted as one or more instructions or code on a computer-readable medium, which may be incorporated into a computer program product. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, substantially any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method of wireless communication at a user equipment, comprising:
    receiving a plurality of reference signal (RS) tones in a plurality reference signals from a first base station;
    modifying the plurality of RS tones to remove interference from at least one other base station;
    determining a quality of the plurality of RS tones as modified;
    obtaining at least one channel estimate of at least one data tone based on the quality of the plurality of RS tones as modified; and
    decoding a data channel of the first base station based on the at least one channel estimate,
    wherein determining the quality of the plurality of RS tones comprises determining whether a signal is transmitted by the at least one other base station on the plurality of RS tones based in part on at least one of:
        a resource partitioning between the first base station and the at least one other base station,
        a multimedia broadcast over single frequency network (MBSFN) configuration of the first base station and the at least one other base station,
        an almost blank subframe (ABS) configuration of the first base station and the at least one other base station, or
        a received power comparison between at least one of the plurality of RS tones and an interference-canceled RS tone, another data tone, a null tone, or one or more tones related to the MBSFN subframe configuration or ABS configuration.

2. The method of claim 1, wherein the determining of the quality of the plurality of RS tones comprises determining whether a signal transmitted by the at least one other base station on the plurality of RS tones is canceled during the modifying.

3. The method of claim 1, wherein the determining the quality of the plurality of RS tones is based in part on one or more of a distance in time of the plurality of RS tones from the data channel, a frequency offset, a rate of change of a wireless channel, or a combination thereof.

4. The method of claim 1, wherein decoding the data channel comprises attempting decoding using at least two channel estimates for the at least one data tone.

5. The method of claim 4, wherein the at least two channel estimates are based on at least one of:

a combination of the plurality of RS tones, or
different weights for the plurality of RS tones.

6. The method of claim 5, further comprising selecting the at least one of the combination of the plurality of RS tones or the different weights for the plurality of RS tones based on a classification of the plurality of RS tones relating to the quality of the plurality of RS tones.

7. The method of claim 1, further comprising:
obtaining at least one interference estimate based on one or more of:
a subset of the plurality of RS tones that are determined to have similar quality as the data channel,
a set of data tones,
a set of null tones, or
a combination thereof; and
wherein the decoding is further based on the at least one interference estimate.

8. The method of claim 1, wherein the modifying comprises canceling the interference caused by one or more of:
an RS,
another data channel,
a broadcast channel received from the at least one other base station, or
a combination thereof.

9. The method of claim 1, wherein the data channel is a primary broadcast channel.

10. An apparatus for wireless communication, comprising:
means for receiving a plurality of reference signal (RS) tones in a plurality reference signals from a first base station;
means for modifying the plurality of RS tones to remove interference from at least one other base station;
means for determining a quality of the plurality of RS tones as modified;
means for obtaining at least one channel estimate of at least one data tone based on the quality of the plurality of RS tones as modified; and
means for decoding a data channel of the first base station based on the at least one channel estimate,
wherein the means for determining the quality of the plurality of RS tones is configured to determine whether a signal is transmitted by the at least one other base station on the plurality of RS tones based in part on at least one of:
a resource partitioning between the first base station and the at least one other base station,
multimedia broadcast over single frequency network (MBSFN) configuration of the first base station and the at least one other base station,
an almost blank subframe (ABS) configuration of the firs base station and the at least one other base station, or
a received power comparison between at least one of the plurality of RS tones and an interference-canceled RS tone, another data tone, a null tone, or one or more tones related to the MBSFN subframe configuration or ABS configuration.

11. The apparatus of claim 10, wherein the means for determining determines the quality of the plurality of RS tones based on whether the means for modifying cancels a signal transmitted by the at least one other base station on the plurality of RS tones.

12. An apparatus for wireless communication, comprising:
a memory; and
at least one processor coupled to the memory and configured to:
receive a plurality of reference signal (RS) tones in a plurality reference signals from a first base station;
modify the plurality of RS tones to remove interference from at least one other base station;
determine a quality of the plurality of RS tones as modified;
obtain at least one channel estimate of at least one data tone based on the quality of the plurality of RS tones as modified; and
decode a data channel of the first base station based on the at east one channel estimate,
wherein the at least one processor is configured to determine the quality of the plurality of RS tones by determining whether a signal is transmitted by the at least one other base station on the plurality of RS tones based in park on at least one of:
a resource partitioning between the first base station and the at least one other base station,
a multimedia broadcast over single frequency network (MBSFN) configuration of the first base station and the at least one other base station,
an almost blank subframe (ABS) configuration of the first base station and the at least one other base station, or
a received power comparison between at least one of the plurality of RS tones and an interference-canceled RS tone, another data tone, a null tone, or one or more tones related to the MBSFN subframe configuration or ABS configuration.

13. The apparatus of claim 12, wherein the at least one processor determines the quality of the plurality of RS tones based on whether a signal transmitted by the at least one other base station on the plurality of RS tones is canceled as part of the at least one processor modifying the plurality of RS tones.

14. The apparatus of claim 12, wherein the at least one processor determines the quality of the plurality of RS tones based in part on one or more of a distance in time of the plurality of RS tones from the data channel, a frequency offset, a rate of change of a wireless channel, or a combination thereof.

15. The apparatus of claim 12, wherein the at least one processor decodes the data channel based on attempting decoding using at least two channel estimates for the at least one data tone.

16. The apparatus of claim 15, wherein the at least two channel estimates are determined based on at least one of:
a combination of the plurality of RS tones, or
different weights for the plurality of RS tones.

17. The apparatus of claim 16, wherein the at least one processor is further configured to select the at least one of the combination of the plurality of RS tones or the different weights for the plurality of RS tones based on a classification of the plurality of RS tones relating to the quality of the plurality of RS tones.

18. The apparatus of claim 12, wherein the at least one processor is further configured to:
obtain at least one interference estimate based on one or more of:
a subset of the plurality of RS tones that are determined to have similar quality as the data channel,
a set of data tones,
a set of null tones, or
a combination thereof; and
wherein the at least one processor decodes the data channel further based on the at least one interference estimate.

19. The apparatus of claim 12, wherein the at least one processor modifies the plurality of RS tones in part by canceling the interference caused by one or more of:
- an RS,
- another data channel,
- a broadcast channel received from the at least one other base station, or
- a combination thereof.

20. The apparatus of claim 12, wherein the data channel is a primary broadcast channel.

21. A computer program product for wireless communication stored on a non-transitory computer-readable medium and comprising code that when executed on at least one computer performs the steps of:
- receiving a plurality of reference signal (RS) tones in a plurality reference signals from a first base station;
- modifying the plurality of RS tones to remove interference from at least one other base station;
- determining a quality of the plurality of RS tones as modified;
- obtaining at least one channel estimate of at least one data tone based on the quality of the plurality of RS tones as modified; and
- decoding a data channel of the first base station based on the at least one channel estimate,
- wherein determining the quality of the plurality of RS tones comprises determining whether a signal is transmitted by the at least one other base station on the plurality of RS tones based in part on at least one of:
  - a resource partitioning between the first base station and the at least one other base station,
  - a multimedia broadcast over single frequency network (MBSFN) configuration of the first base station and the at least one other base station,
  - an almost blank subframe (ABS) configuration of the first base station and the at least one other base station, or
  - a received power comparison between at least one of the plurality of RS tones and an interference-canceled RS tone, another data tone, a null tone, or one or more tones related to the MBSFN subframe configuration or ABS configuration.

22. The computer program product of claim 21, wherein the quality of the plurality of RS tones is determined based on whether a signal transmitted by the at least one other base station on the plurality of RS tones is canceled during the modifying.

* * * * *